United States Patent
Chin et al.

(10) Patent No.: US 7,385,236 B2
(45) Date of Patent: Jun. 10, 2008

(54) BIFET SEMICONDUCTOR DEVICE HAVING VERTICALLY INTEGRATED FET AND HBT

(75) Inventors: Yu-Chung Chin, Chung-Li (TW); Chao-Hsing Huang, Nan-Tou Hsien (TW); Wei-Chou Wang, Shu-Lin (TW); Kun-Chuan Lin, Taipei (TW)

(73) Assignee: Visual Photonics Epitaxy Co., Ltd., Taoyuan (TW)

( * ) Notice: Subject to any disclaimer, the term of this patent is extended or adjusted under 35 U.S.C. 154(b) by 469 days.

(21) Appl. No.: 11/256,528

(22) Filed: Oct. 21, 2005

(65) Prior Publication Data

US 2007/0090399 A1    Apr. 26, 2007

(51) Int. Cl.
*H01L 29/80* (2006.01)
*H01L 31/112* (2006.01)

(52) U.S. Cl. ............................ 257/273; 257/E27.015
(58) Field of Classification Search .......... 257/192, 257/197, 195, 272, 273, 279–281, E27.012, 257/E27.015
See application file for complete search history.

(56) References Cited

U.S. PATENT DOCUMENTS

| | | | | |
|---|---|---|---|---|
| 5,250,826 A | * | 10/1993 | Chang et al. | 257/273 |
| 5,332,451 A | | 7/1994 | Hata et al. | 148/33.2 |
| 6,906,359 B2 | * | 6/2005 | Zampardi et al. | 257/197 |
| 7,015,519 B2 | * | 3/2006 | Krutko et al. | 257/197 |

* cited by examiner

Primary Examiner—Thien F Tran

(57) ABSTRACT

The invention provides a BiFET semiconductor device vertically integrating a FET and a HBT on the same substrate. The BiFET semiconductor device comprises a HBT structure, a high-resistivity structure, and a FET structure, sequentially formed in this order from bottom to top on a semi-insulating substrate. The high-resistivity structure comprises at least two layers. A first layer is on top of the HBT structure to provide the required high resistivity, while the second layer having a high purity is on top of the first layer to prevent the doped impurity in the first layer to affect the upper FET structure.

19 Claims, 4 Drawing Sheets

BIFET SEMICONDUCTOR DEVICE HAVING VERTICALLY INTEGRATED FET AND HBT

BACKGROUND OF THE INVENTION

1. Field of the Invention

The present invention generally relates to semiconductor devices, and more particularly to a BiFET semiconductor device having vertically integrated field effect transistors (FET) and hetero-junction bipolar transistors (HBT) on the same substrate.

2. The Prior Arts

Integrating a FET and a HBT on the same substrate is commonly referred to as a BiFET semiconductor device. The benefit of BiFET devices is well known in analog circuits as they are operable under very high frequency while offering greater functionality. These features are particularly useful in RF or mobile communication devices. One typical application of the BiFET device is in implementing the power amplifier (PA) in a cellular handset.

For conventional BiFETs, FETs and HBTs are integrated laterally on the same substrate. One such lateral integration of FETs and HBTs is disclosed in U.S. Pat. No. 5,280,826, whose reference drawing is included as FIG. 1.

As illustrated, a laterally integrated HBT-FET device 10 contains an n-p-n GaAs HBT 11 formed on the substrate 12 and the HBT 11 includes, from bottom to top, a n+ GaAs layer 14 as sub-collector, a n− GaAs layer 16 as collector, a p+ GaAs layer 18 as base, and an emitter structure, which is composed of a n− AlGaAs layer 20 as emitter, a n− GaAs layer 22 as emitter cap, and a n+ InGaAs layer 24 as emitter contact. A metal semiconductor FET (MESFET) 15 is constructed using the same layers of material of the HBT 11's emitter structure. The n-FET 15 has a source (S) and a drain (D) formed in the n+ InGaAs layer 24, a gate recess etched in the InGaAs layer 24 between the source and drain, and a Schottky gate metal contact (G) deposited on the n− GaAs layer 22 exposed in the gate recess. The n-p-n HBT 11 and the n-FET 15 are isolated by ion implantation 26.

Enabling greater functionality in a smaller package is a key challenge for MMIC (monolithic microwave IC) manufacturers. In the lateral integration of FETs and HBTs, the FETs constructed are usually MESFETs whose performance is not as good as Pseudomorphic High Electron Mobility Transistors (PHEMT). If the vertical integration of HBTs and FETs could really be achieved, more advanced PHEMT could be adopted, giving the BiFET device more flexibility in terms of its application and performance. However, to construct BiFET semiconductor device having a vertical structure requires effective isolation of the vertically stacked FETs and HBTs, which is very difficult.

The technique provided by Hata et al. in U.S. Pat. No. 5,332,451 suggests a way to achieve such an effective isolation. The objective of Hata et al. is to provide an epitaxial crystal with high resistivity to enable the fabrication of high-speed electronic elements. The epitaxial crystal provided by Hata et al. comprises a substrate, a buffer layer, and an active layer sequentially formed in this order from bottom to top. The buffer layer comprises, from bottom to top, a first layer made of AlGaAs, AlGaInP, or InAlAs doped with oxygen and/or a transition metal, and a second layer made of high-purity GaAs, InGaP, AlGaAs, or InP. The dopant oxygen or transition metal in the first layer is for achieving high resistivity, and the second layer is constructed so that the dopant's influence on the electronic elements (such as FET) fabricated on top of the epitaxial crystal could be diminished to a practically negligible level.

SUMMARY OF THE INVENTION

In light of the various advantages of vertically structured BiFET semiconductor devices, the present invention provides a BiFET semiconductor device vertically integrating a FET and a HBT on the same substrate, with a high-resistivity structure therebetween to achieve effective isolation.

The BiFET semiconductor device according to the present invention comprises a HBT structure, a high-resistivity structure, and a FET structure, sequentially arranged in this order from bottom to top on a semi-insulating substrate.

The high-resistivity structure comprises at least two layers. A first layer is on top of the HBT structure's emitter contact layer to provide the required high resistivity. The first layer could be (1) a low-temperature grown GaAs layer; (2) a low-temperature grown InGaP layer; (3) a GaAs, $Al_xGaAs$ ($0<x\leq1$), InAlAs, or $In_yAl_zGaP$ ($0<y,z\leq1$) layer doped with oxygen or a transition metal of an appropriate doping density; or (4) a stacking of GaAs, $Al_xGaAs$ ($0<x\leq1$), or $In_yAl_zGaP$ ($0<y,z\leq1$) sub-layers each doped with oxygen or a transition metal of an appropriate doping density.

A second layer is a high purity layer on top of the first layer to prevent the doped impurity in the first layer to affect the upper FET structure. The second layer could be (1) a high purity GaAs, $Al_xGaAs$ ($0<x\leq1$), InAlAs, or $In_yAl_zGaP$ ($0<y,z\leq1$) layer having an appropriate active concentration; or (2) a stacking of pure GaSa, $Al_xGaAs$ ($0<x\leq1$), and $In_yAl_zGaP$ ($0<y,z\leq1$) sub-layers each having an appropriate active concentration. Each of the first and the second layers of the high-resistivity structure has an appropriate thickness.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
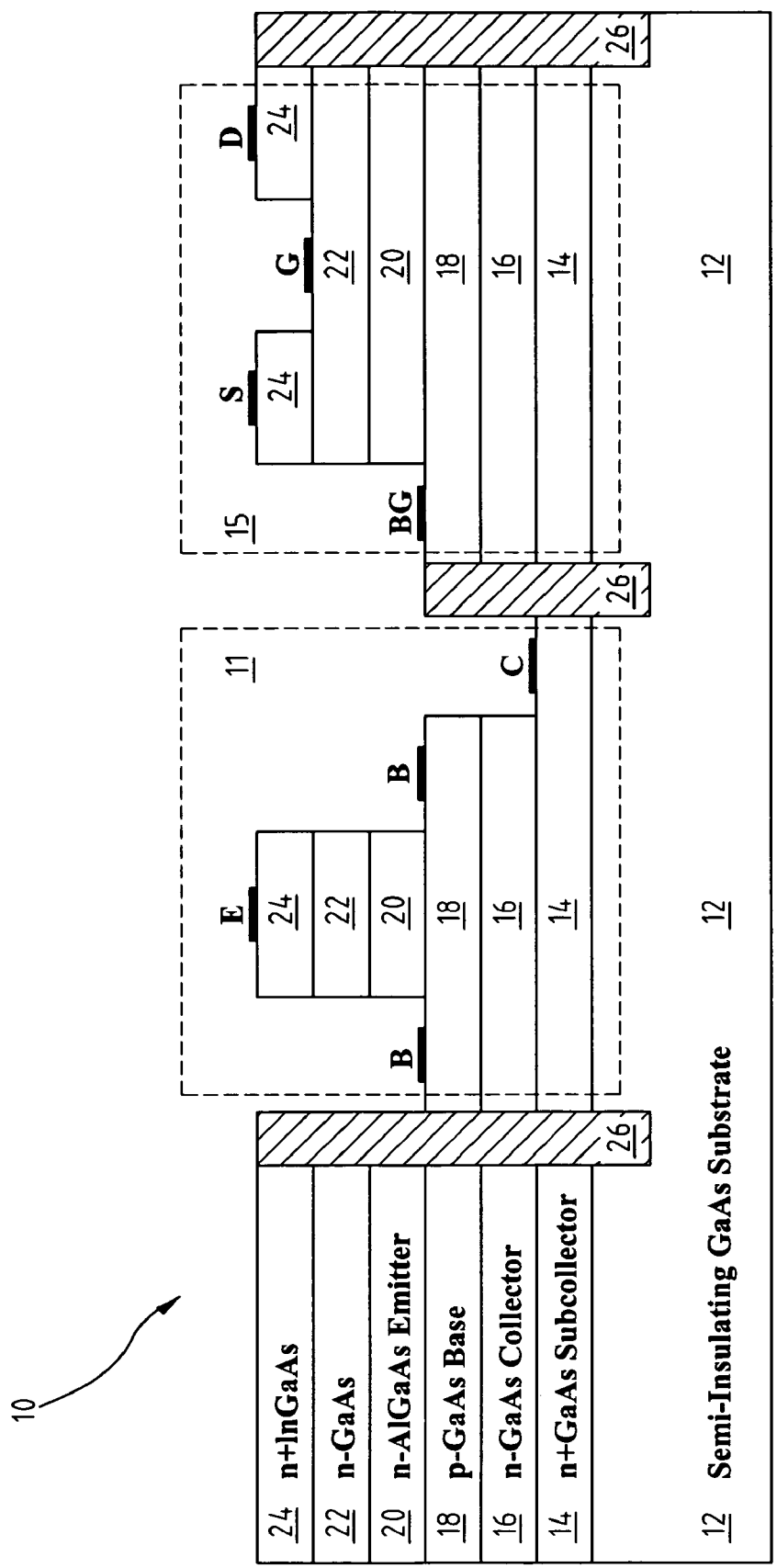
FIG. 1 is a schematic sectional view showing a conventional BiFET semiconductor device according to U.S. Pat. No. 5,280,826.
Figure 2A:
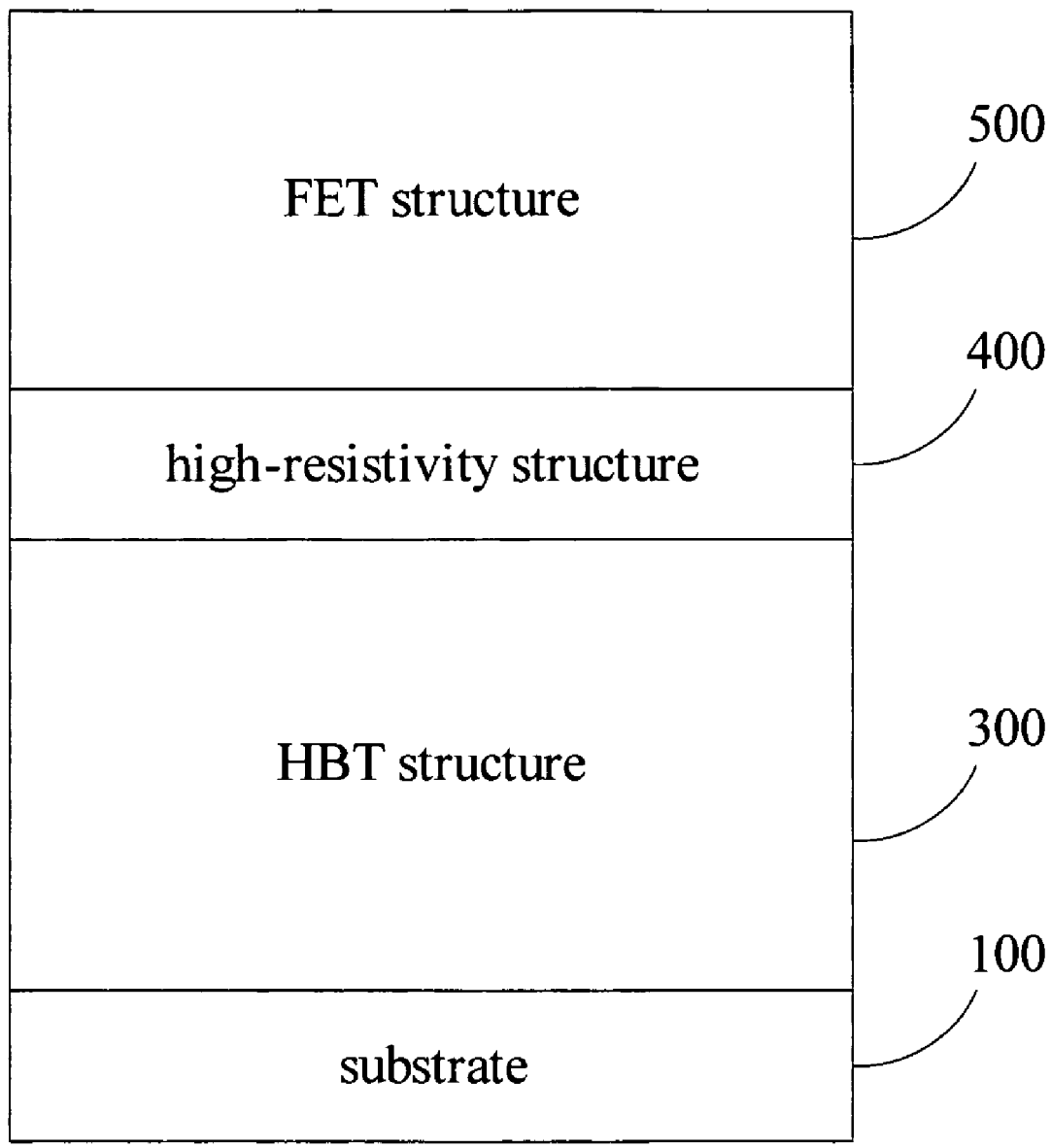
FIG. 2a is a schematic sectional view showing the BiFET semiconductor device according to the present invention.

As shown in FIG. 2a, the BiFET semiconductor device according to the present invention comprises a HBT structure 300, a high-resistivity structure 400, and a FET structure 500, sequentially formed, either by continuous or non-continuous growing processes, in this order from bottom to top on a side of a semi-insulating substrate 100. The semi-insulating substrate 100 could be made of, but is not limited to, GaAs or InP. The HBT structure 300 could be an npn-HBT or a pnp-HBT. The FET structure 500 could be an n-channel FET, a p-channel FET, MESFET, or any appropriate type of FET. Depending on the substrate material, the compound semiconductors for the HBT structure 300, the high-resistivity structure 400, and the FET structure 500 and their compositions could be selected so as to have their lattice constant close to that of the substrate 100 and to avoid excessive strain affecting the quality of the BiFET semiconductor device. For example, when a GaAs substrate 100 is used, compound semiconductors such as GaAs, AlGaAs, InGaAs, and InGaP are usually used for the upper structures and, when an InP substrate 100 is used, compound semiconductors such as InP, InGaAs, InAlAs, and GaAsSb can be used. Besides the foregoing binary and ternary compound semiconductors, quaternary or higher compound semiconductors such as InAlGaP and InGaAsP can also be used.

Figure 2B:
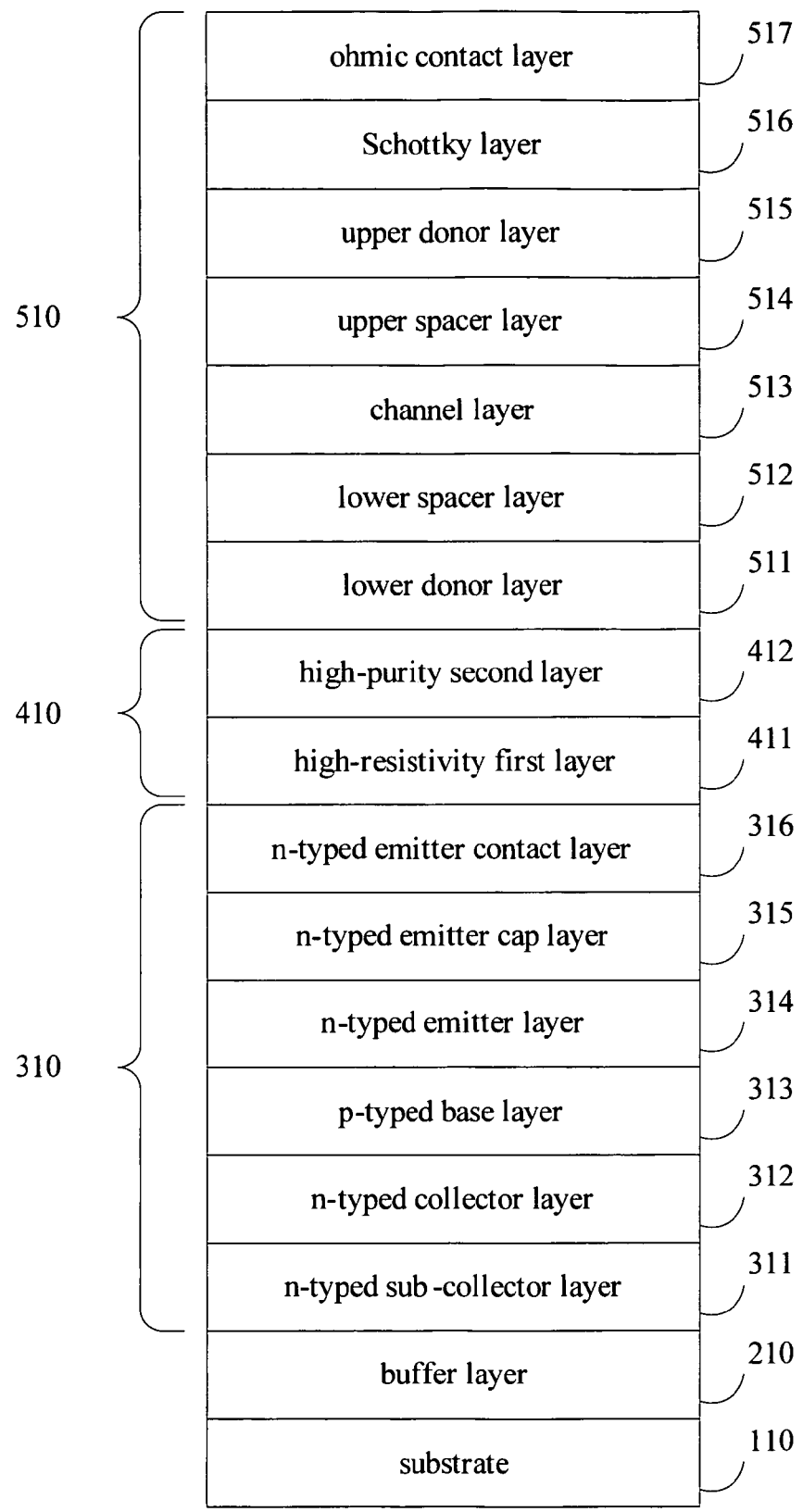
FIG. 2b is a schematic sectional view showing the BiFET semiconductor device according to an embodiment of the present invention.

In the following, without losing generality, an exemplary fabrication process of a BiFET semiconductor device according to an embodiment of the present invention is described using a GaAs substrate 110, an npn-HBT 310, and an n-channel FET 510. FIG. 2b is a schematic sectional view showing the BiFET semiconductor device after the fabrication process is completed.

On a side of the GaAs substrate 110, an optional buffer layer 210 is first grown using un-doped GaAs, up-doped $Al_xGaAs$ ($0<x\leq1$), or un-doped $In_yAl_zGaP$ ($0<y,z\leq1$), or un-doped InGaP. The optional buffer layer 210 could also be formed by growing sub-layers of the foregoing materials in an appropriate order. The total thickness of the buffer layer 210 is between 200~20,000 Å. It is to be noted that the foregoing process and structure of the buffer layer is only exemplary; there are various other ways to form the buffer layer of the BiFET semiconductor according to the present invention.

Then, on top of the buffer layer 210, an n-typed sub-collector layer 311 is grown using doped GaAs, $Al_xGaAs$ ($0<x\leq1$), $In_yAl_zGaP$ ($0<y,z\leq1$), or InGaP. The n-typed sub-collector layer 311 could also be formed by layers of the foregoing materials in an appropriate order. The dopant could be Si, S, Te, Se, or any appropriate element in making the material of the sub-collector layer 311 into an n-typed material, with a doping density between $1e18$~$1e19$ cm$^{-3}$. The total thickness of the sub-collector layer 311 is between 200~20,000 Å. Subsequently, a similar n-typed collector layer 312 is grown based on the same set of materials and dopants but with a less doping density (between $1e15$~$5e17$ cm$^{-3}$) and a larger thickness between 500~50,000 Å.

On top of the collector layer 312, a p-typed base layer 313 is grown using doped GaAs, $In_xGaAs$ ($0<x\leq0.3$), $GaAsSb_y$ ($0<y\leq0.3$), or $In_wGaAsN_z$ ($0<w,z\leq0.3$). The dopant used is carbon (C) from materials such as, but not limited to, $CBr_4$, $CCl_4$, $CBrCl_3$, TMAs, TMGa, with a doping density between $1e19$~$3e20$ cm$^{-3}$. The total thickness of the base layer 313 is between 50~5,000 Å.

Subsequently, an n-typed emitter layer 314 is grown on the base layer 313 using doped $Al_xGaAs$ ($0<x\leq0.5$), $In_yAl_zGaP$ ($0<y,z\leq0.5$), or InGaP. The emitter layer 314 could have its composition (i.e., x, y, z, in the foregoing molecular formulas) continuously increased along its thickness from bottom to top. The dopant could be Si, S, Te, Se, or any appropriate element in making the material of the emitter layer 314 into an n-typed material, with a doping density between $1e17$~$1e18$ cm$^{-3}$. The total thickness of the emitter layer 314 is between 100~2,000 Å. Then, on top of the emitter layer 314, an n-typed emitter cap layer 315 is grown using doped GaAs, $Al_xGaAs$ ($0<x\leq0.5$), or $In_yAl_zGaP$ ($0<y,z\leq0.5$), or InGaP. The n-type emitter cap layer 315 could also be formed by layers of the foregoing materials in an appropriate order. The dopant could be Si, S, Te, Se, or any appropriate element in making the material of the emitter cap layer 315 into an n-type material, with a doping density between $1e16$~$1e19$ cm$^{-3}$. The total thickness of the emitter cap layer 315 is between 50~5,000 Å.

Then, on top of the emitter cap layer 315, an n-typed emitter contact layer 316 is grown using doped GaAs or $In_xGaAs$ ($0<x\leq1$), with a fixed composition or a composition continuously increased along its thickness from bottom to top. The emitter contact layer 316 could also be formed by layers of the foregoing materials in an appropriate order. The dopant could be Si, S, Te, Se, or any appropriate element in making the material of the emitter contact layer 316 into an n-typed material, with a doping density between $3e18$~$1e20$ cm$^{-3}$. The total thickness of the emitter contact layer 316 is between 100~2,000 Å. Up to this point, the HBT structure 310 is completed. Again, it is to be noted that the foregoing process and structure of the HBT structure is only exemplary; there are various other ways to form the HBT structure of the BiFET semiconductor device according to the present invention.

The high-resistivity structure 410 comprises at least two layers 411 and 412. The first layer 411 is grown on top of the emitter contact layer 316 to provide the required high resistivity (>1e7 ohm-cm). The first layer 411 could be (1) a GaAs layer having a thickness between 500~50,000 Å formed by a low-temperature growing process; (2) a InGaP layer having a thickness 500~50,000 Å formed by a low-temperature growing process; (3) a GaAs, $Al_xGaAs$ ($0<x\leq1$), InAlAs, or $In_yAl_zGaP$ ($0<y,z\leq1$) layer doped with oxygen or a transition metal of a doping density between $1e16$~$1e22$ cm$^{-3}$ and a thickness between 500~50,000 Å; or (4) a stacking of GaAs, $Al_xGaAs$ ($0<x\leq1$), and $In_yAl_zGaP$ ($0<y,z\leq1$) sub-layers each doped with oxygen or a transition metal of a doping density between $1e16$~$1e22$ cm$^{-3}$ and a total thickness between 500~50,000 Å.

The second layer 412 is a high purity layer grown on top of the first layer 411 to prevent the doped impurity in the first layer 411 to affect the subsequently formed FET structure 510. The second layer 412 could be a high-purity GaAs layer with an active concentration <5e15 cm$^{-3}$, a high-purity $Al_xGaAs$ ($0<x\leq1$) layer with an active concentration <5e16 cm$^{-3}$, a high-purity $In_yAl_zGaP$ ($0<y,z\leq1$) layer with an active concentration <5e16 cm$^{-3}$, or a high-purity InAlAs layer with an active concentration <5e16 cm$^{-3}$, all having a thickness between 300~30,000 Å. The second layer 412 could also be a stacking of sub-layers made of the foregoing materials with a total thickness between 300~30,000 Å.

Subsequently, the FET structure 510 is formed on top of the high-purity second layer 412 of the high-resistivity structure 410. First, an optional lower donor layer 511 made of GaAs, $Al_xGaAs$ ($0<x\leq1$), InGaP, or $In_yAl_zGaP$ ($0<y,z\leq1$) is grown using Si as dopant with uniform doping (doping density up to $1e19$ cm$^{-3}$) or impulse-typed doping (doping density up to $1e13$ cm$^{-3}$). The thickness of the lower donor layer 511 is up to 1000 Å. On top of the lower donor layer 511, an optional lower spacer layer 512 is grown using GaAs, $Al_xGaAs$ ($0<x\leq1$), $In_yAl_zGaP$ ($0<y,z\leq1$), or InGaP, with a thickness up to 100 Å.

Then a channel layer 513 is grown on top of the lower spacer layer 512 using GaAs, $In_xGaAs$ ($0<x\leq0.5$), $Al_yGaAs$ ($0<y\leq0.3$), $In_wAl_zGaP$ ($0<w,z\leq0.5$), or InGaP, with a thickness between 10~300 Å. On top of the channel layer 513, there could be an optional upper spacer layer 514 and an optional upper donor layer 515 using the same set of materials with similar thickness as the lower spacer layer 512 and the lower donor layer 511.

Subsequently, a Schottky layer 516 is grown on the upper donor layer 515 using $Al_xGaAs$ ($0<x\leq1$), $In_yAl_zGaP$ ($0<y,z\leq1$), or InGaP. The Schottky layer 516 could also be formed by layers of the foregoing three materials in an appropriate order. The Schottky layer 516 could be optionally doped by Si with a doping density up to 3e18 cm$^{-3}$. The total thickness of the Schottky layer 516 is between 10~3,000 Å. On top of the Schottky layer 516, an ohmic contact layer 517 is formed using GaAs, In$_x$GaAs (0<x≦1) or In$_x$GaAs$_y$Sb (0<x,y≦1). The ohmic contact layer 517 could also be formed by layers of the foregoing materials in an appropriate order. The ohmic contact layer 517 could also be optionally doped with Si, S, Te, Se with a doping density up to 1e20 cm$^{-3}$. The total thickness of the ohmic contact layer 517 is between 100~3,000 Å. Again, it is to be noted that the foregoing process and structure of the FET structure are only exemplary; there are various other ways to form the FET structure of the BiFET semiconductor according to the present invention.

Figure 2C:
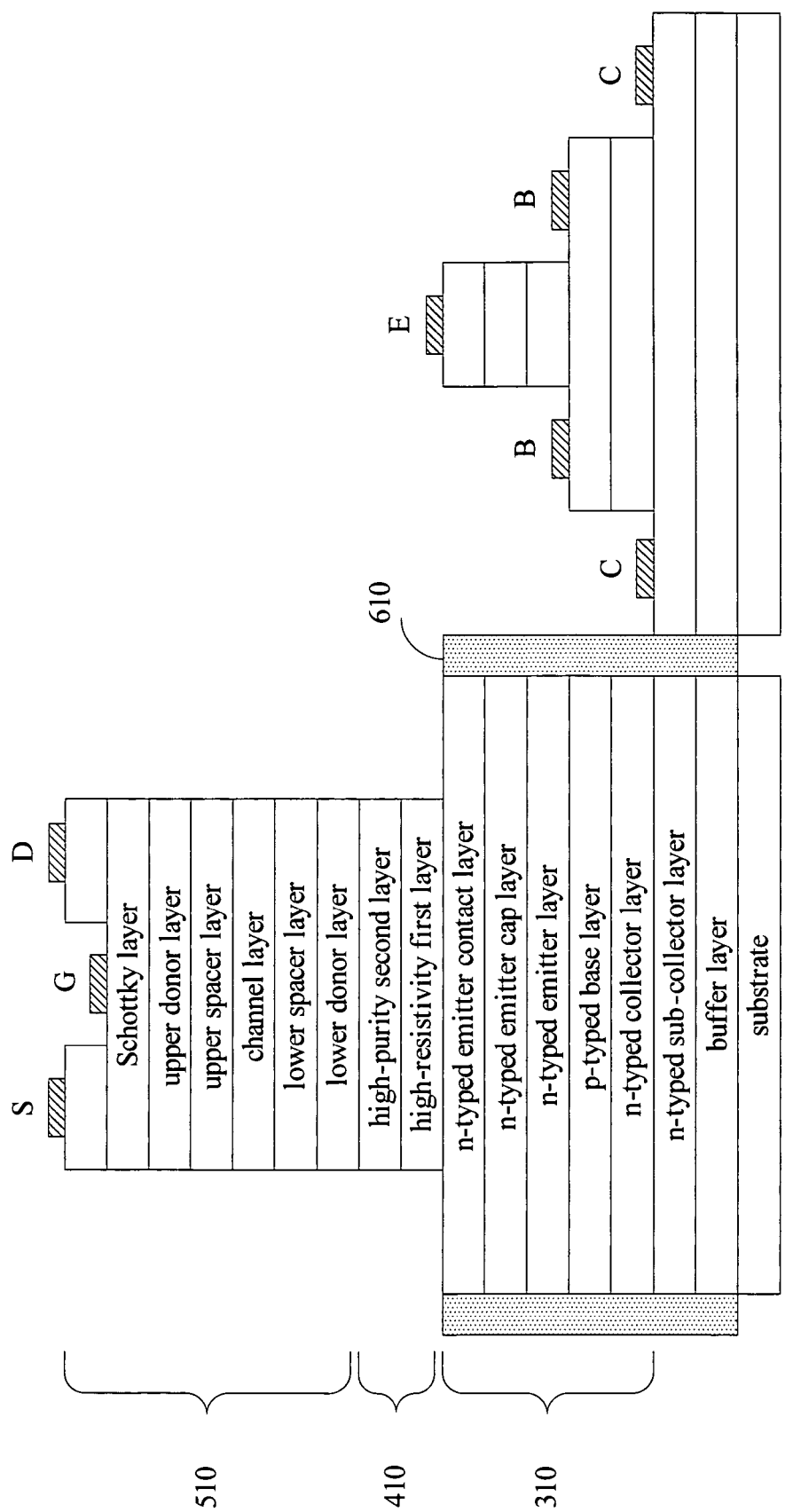
FIG. 2c is a schematic sectional view showing a HBT and a FET formed from the BiFET semiconductor device of FIG. 2b.

Up to this point, the BiFET semiconductor device according to an embodiment of the present invention is completed. Subsequently, the BiFET semiconductor device can undergo appropriate processes to form the isolation 610 between FET and HBT by ion implantation or etching, and the electrodes S (source), G (gate), D (drain), C (collector), B (base), and E (emitter), as illustrated in FIG. 2c.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A BiFET semiconductor device, comprising
   a semi-insulating substrate;
   a first layered structure forming a HBT comprising a plurality of sequentially stacked and appropriately doped semiconductor layers on top of a side of said semi-insulating substrate;
   a second layered structure on top of said first layered structure, said second layered structure comprising:
      a first semiconductor layer providing an appropriately high resistivity; and
      a second semiconductor layer having an appropriately high purity; and
   a third layered structure forming a FET comprising a plurality of sequentially stacked and appropriately doped semiconductor layers on top of said high-resistivity structure.

2. The BiFET semiconductor device according to claim 1, wherein said first layered structure forms one of an npn-HBT and a pnp-HBT.

3. The BiFET semiconductor device according to claim 1, wherein said third layered structure forms one of an n-channel FET and a p-channel FET.

4. The BiFET semiconductor device according to claim 1, wherein said first layer of said second layered structure is made of GaAs formed by a low-temperature growing process.

5. The BiFET semiconductor device according to claim 1, wherein said first layer of said second layered structure is made of InGaP formed by a low-temperature growing process.

6. The BiFET semiconductor device according to claim 1, wherein said first layer of said second layered structure is made of one of the following materials: GaAs, Al$_x$GaAs (0<x≦1), In$_y$Al$_z$GaP (0<y,z≦1) and InAlAs, doped with one of oxygen and an appropriate transition metal of an appropriate doping density.

7. The BiFET semiconductor device according to claim 6, wherein said appropriate doping density is between 1e16~1e22 cm$^{-3}$.

8. The BiFET semiconductor device according to claim 1, wherein said first layer of said second layered structure comprises a plurality of sequentially stacked semiconductor sub-layers, each of which is made of one of the following materials: GaAs, Al$_x$GaAs (0<x≦1), and In$_y$Al$_z$GaP (0<y,z≦1), doped with one of oxygen and an appropriate transition metal of an appropriate doping density.

9. The BiFET semiconductor device according to claim 8, wherein said doping density of oxygen is between 1e16~1e22 cm$^{-3}$.

10. The BiFET semiconductor device according to claim 1, wherein said first layer of said second layered structure has a thickness between 500~50,000 Å.

11. The BiFET semiconductor device according to claim 1, wherein said second layer of said second layered structure is made of one of the following material: a high-purity GaAs with an active concentration <5e15 cm–3, a high-purity Al$_x$GaAs (0<x≦1) with an active concentration <5e16 cm–3, a high-purity In$_y$Al$_z$GaP (0<y,z≦1) with an active concentration <5e16 cm–3, and a high-purity InAlAs with an active concentration <5e16 cm–3.

12. The BiFET semiconductor device according to claim 1, wherein said second layer of said second layered structure comprises a plurality of sequentially stacked semiconductor sub-layers, each of which is made of one of the following material: a high-purity GaAs with an active concentration <5e15 cm–3, a high-purity Al$_x$GaAs (0<x≦1) with an active concentration <5e16 cm–3, and a high purity In$_y$Al$_z$GaP (0<y,z≦1) with an active concentration <5e16 cm–3.

13. The BiFET semiconductor device according to claim 1, wherein said second layer of said second layered structure has a thickness between 300~30,000 Å.

14. The BiFET semiconductor device according to claim 1, further comprising a buffer layer positioned between said semi-insulating substrate and said first layered structure.

15. The BiFET semiconductor device according to claim 14, wherein said buffer layer is made of one of the following materials: un-doped GaAs, un-doped Al$_x$GaAs (0<x≦1), un-doped In$_y$Al$_z$GaP (0<y,z≦1), and un-doped InGaP.

16. The BiFET semiconductor device according to claim 14, wherein said buffer layer comprises a plurality of sequentially stacked semiconductor sub-layers, each of which is made of one of the following materials: un-doped GaAs, un-doped Al$_x$GaAs (0<x≦1), un-doped In$_y$Al$_z$GaP (0<y,z≦1), and un-doped InGaP.

17. The BiFET semiconductor device according to claim 14, wherein said buffer layer has a thickness between 200~20,000 Å.

18. The BiFET semiconductor device according to claim 1, wherein said appropriately high resistivity of said second layered structure is at least 1e7 ohm-cm.

19. The BiFET semiconductor device according to claim 1, wherein said semi-insulating substrate is made of one of GaAs and InP.

* * * * *